United States Patent [19]

Osakabe et al.

[11] Patent Number: 5,713,413
[45] Date of Patent: Feb. 3, 1998

[54] COOLING APPARATUS USING BOILING AND CONDENSING REFRIGERANT

[75] Inventors: Hiroyuki Osakabe, Chita-gun; Kiyoshi Kawaguchi, Toyota; Masahiko Suzuki, Hoi-gun; Hajime Sugito, Nagoya; Kazuo Kobayashi, Kariya; Shigeru Kadota, Hekinan, all of Japan

[73] Assignee: Nippondenso Co., Ltd., Aichi-pref., Japan

[21] Appl. No.: 579,301

[22] Filed: Dec. 27, 1995

[30] Foreign Application Priority Data

Dec. 28, 1994 [JP] Japan ................................ 6-328515
Jul. 5, 1995 [JP] Japan ................................ 7-169574

[51] Int. Cl.⁶ .............................................. F28D 15/00
[52] U.S. Cl. ................... 165/104.33; 361/700; 257/715
[58] Field of Search ................. 165/104.33; 361/700; 257/715

[56] References Cited

U.S. PATENT DOCUMENTS

| | | | |
|---|---|---|---|
| 4,653,579 | 3/1987 | Fujii et al. | 165/104.33 X |
| 4,694,323 | 9/1987 | Itahana et al. | 257/715 |
| 4,862,321 | 8/1989 | Saitoo et al. | 361/700 |
| 4,949,164 | 8/1990 | Ohashi et al. | 361/700 X |
| 5,613,552 | 3/1997 | Osakabe et al. | 165/104.21 |

FOREIGN PATENT DOCUMENTS

| | | | |
|---|---|---|---|
| 51-015843 | 2/1976 | Japan . | |
| 51-118038 | 10/1976 | Japan . | |
| 3145141 | 12/1978 | Japan | 165/104.33 |
| 55-051345 | 12/1980 | Japan . | |
| 0152150 | 9/1982 | Japan | 165/104.33 |
| 57-204156 | 12/1982 | Japan . | |
| 7204156 | 12/1982 | Japan | 257/715 |
| 0131755 | 8/1983 | Japan | 165/104.33 |
| 1151258 | 6/1989 | Japan | 257/715 |
| 2-078256 | 3/1990 | Japan . | |
| 5-326774 | 12/1993 | Japan . | |
| 1261029 | 9/1986 | U.S.S.R. | 257/715 |

OTHER PUBLICATIONS

Ser. No. 08/497950, Jul. 1995, Osakabe et al.
Ser. No. 08/504025, Jul. 1995, Osakabe et al.
Ser. No. 08/503862, Jul. 1995, Osakabe et al.
Ser. No. 08/524437, Sep. 1995, Osakabe et al.

*Primary Examiner*—John Rivell
*Assistant Examiner*—Christopher Atkinson
*Attorney, Agent, or Firm*—Cushman, Darby & Cushman IP Group of Pillsbury Madison & Sutro LLP

[57] ABSTRACT

According to the present invention, a cooling apparatus includes a refrigerant tank composed of at least a couple of thin plate materials facing each other and bonded together at bonding parts thereof, a heating body mounted on an outer surface of the thin plates, refrigerant sealed in the refrigerant tank for absorbing heat generated by the heating body, the refrigerant vaporizing in the refrigerant tank, a heat radiator mounted on the refrigerant tank in fluid communication therewith for condensing and liquefying boiling vapor ascending from the refrigerant tank, and a refrigerant flow control plate composed of a plate material and disposed in an upper part of the refrigerant tank in contact with the thin plate materials facing each other. The refrigerant flow control plate partitions an inside of the refrigerant tank into a vapor outlet and a liquid inlet. The vapor outlet is defined by one surface of the refrigerant flow control plate and the thin plate materials facing each other to flow out the boiling vapor boiled and ascending within the refrigerant tank into the heat radiator, and the liquid inlet is defined by the other surface of the refrigerant flow control plate and the thin plate materials facing each other to introduce the condensed liquid into the refrigerant tank.

19 Claims, 18 Drawing Sheets

F I G. 30
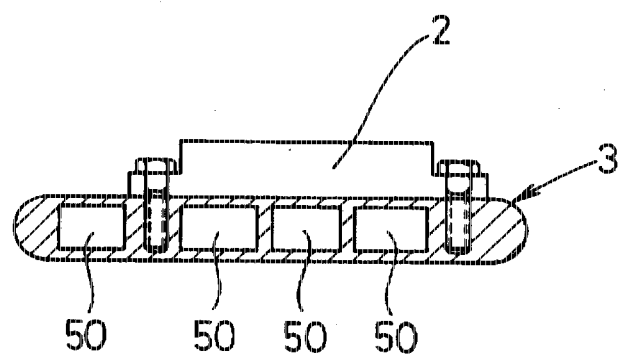

COOLING APPARATUS USING BOILING AND CONDENSING REFRIGERANT

CROSS REFERENCE TO RELATED APPLICATION

This application is based on and claims priority from Japanese application Nos. Hei. 6-328515 filed on Dec. 28, 1995 and Hei. 7-169574 filed on Jul. 5, 1995, the contents of which are incorporated herein by reference.

BACKGROUND OF THE INVENTION

1. Field of the Invention

The present invention generally relates to a cooling apparatus using boiling and condensing refrigerant, and more particularly to a cooling apparatus using boiling refrigerant for cooling a heating body, such as a semiconductor element.

2. Related Art

Conventionally, as an apparatus for cooling a heating body, such as a semiconductor, a cooling apparatus using boiling and condensing refrigerant based on the thermal siphon effect has been proposed.

This cooling apparatus using boiling and refrigerant comprises a refrigerant tank accommodating refrigerant and a condenser (heat radiator) disposed above the refrigerant tank, and a heating body is immersed in the refrigerant. The refrigerant accommodated in the refrigerant tank boils by absorbing heat generated by the heating body, ascends in the vapor phase, and moves into the condenser. The refrigerant vapor having reached the condenser is condensed and liquefied by outside cooling, and returns into the refrigerant tank. By the repetition of this heat transfer due to boiling and condensing, the heat generated by the heating body is transferred to the condenser and then discharged into the outside, while cooling the heating body.

One of such cooling apparatus using boiling refrigerant is disclosed in the Japanese Unexamined Patent Publication No. Sho. 51-15843, for example, in which a box shape refrigerant tank is used. In this prior art, however, refrigerant vapor (or heated refrigerant) boiled and ascending of the refrigerant within the refrigerant tank and the condensed liquid (or cooled refrigerant) condensed and descending flow in opposite directions to each other. As a result, there is a problem in that the natural circulation of the refrigerant is disturbed and the maximum heat delivery quantity is reduced. Furthermore, as the refrigerant tank is of box shape, there is another problem in that it is difficult to manufacture the refrigerant tank and the cost is increased.

In order to prevent the increase in the cost due to the manufacturing difficulty, a cooling apparatus using boiling refrigerant disclosed in the Japanese Laid-Open Patent Publication No. Sho. 55-51345, for example, has been proposed. In this prior art, a refrigerant tank is formed by bonding a plurality of thin plates facing each other, and furthermore the width (thickness) of the refrigerant tank is reduced. Therefore, the refrigerant tank can be formed very easily, and the manufacturing cost can be reduced. However, in this prior art, there is also a problem in that the natural circulation of the refrigerant is disturbed and the maximum heat delivery quantity is reduced.

In order to facilitate the natural circulation of the refrigerant and to prevent the lowering of the maximum heat delivery quantity, a cooling apparatus using boiling and condensing refrigerant disclosed in the Japanese Unexamined Patent Publication No. Sho. 51-118038, for example, has been proposed. In this prior art, cylindrical inner tubes 7 are suspensibly provided within a refrigerant tank comprising a box shape refrigerant tank 1, a cylindrical cooling fins 4 and cylindrical joint tubes 5, and the refrigerant tank is partitioned into a section of a passage through which the cooled refrigerant descends and a section of a passage through which the boiling refrigerant ascends.

In a cooling apparatus using boiling and condensing refrigerant disclosed in the Japanese Unexamined Patent Publication No. Sho. 57-204156, a guide plate is provided within a vapor phase chamber at the lower part within a condenser. In this way, each refrigerant passage within the condenser can be partitioned into a vapor passage through which the refrigerant vapor passes and a condensed liquid passage through which the condensed liquid passes. As a result, the disturbance of the natural circulation of the refrigerant due to the interference between the ascending refrigerant vapor and the descending condensed liquid can be reduced.

In this prior art, however, the refrigerant tank is formed by machining a box-shaped or cylindrical material, and further the inner tubes 7 are suspensibly provided within the refrigerant tank. Therefore, there are problems in that it is very difficult to machine the refrigerant tank and that a large quantity of refrigerant is required as described above.

SUMMARY OF THE INVENTION

In view of these problems, it is the primary object of the present invention to obtain a cooling apparatus using boiling and condensing refrigerant in which the refrigerant quantity remains constant, the refrigerant tank can easily be formed, the construction is simple, and the reduction in the maximum heat delivery quantity can be prevented.

According to the present invention, a cooling apparatus using boiling and condensing refrigerant includes: a heating body; a refrigerant tank composed of at least a couple of thin plate materials facing each other and bonded together at bonding parts thereof, the heating body being mounted on an outer surface of the thin plates; refrigerant sealed in the refrigerant tank for absorbing heat generated by the heating body, the refrigerant vaporizing in the refrigerant tank; a heat radiator mounted on the refrigerant tank in fluid communication therewith for condensing and liquefying boiling vapor ascending from the refrigerant tank; and a refrigerant flow control plate composed of a plate material and disposed in an upper part of the refrigerant tank in contact with the thin plate materials facing each other. The refrigerant flow control plate partitions an inside of the refrigerant tank into a vapor outlet and a liquid inlet. The vapor outlet is defined by one surface of the refrigerant flow control plate and the thin plate materials facing each other to flow out the boiling vapor boiled and ascending within the refrigerant tank into the heat radiator, and the liquid inlet is defined by the other surface of the refrigerant flow control plate and the thin plate materials facing each other to introduce the condensed liquid into the refrigerant tank.

According to the above configuration, since the vapor outlet and the liquid inlet are provided at the upper part within the refrigerant tank, the boiling vapor (refrigerant vapor) boiled and ascending within the refrigerant tank flows out of the refrigerant tank through the vapor outlet, while the condensed liquid condensed within the heat radiator and descending out thereof flows into the refrigerant tank through the liquid inlet.

Furthermore, when the boiling vapor ascending from the refrigerant tank flows into the heat radiator, the boiling vapor does not flow only through the specific passage within the heat radiator, and the boiling vapor can uniformly flow throughout the heat radiator. As a result, there is no large pressure loss, the temperature of the entire heat radiator does not fluctuate, and the entire heat radiator can efficiently be used.

The heating body may be immersed in the inside of the refrigerant tank, or the heating body may be mounted on the outside wall surface of the refrigerant tank in contact therewith.

The vapor outlet and the liquid inlet are formed by the refrigerant flow control plate. When the refrigerant flow control plate collects the boiling vapor boiled and ascending through the refrigerant tank and introduces the boiling vapor into the vapor outlet, the boiling vapor flows out of the vapor outlet. That is, the condensed liquid does not flow into the refrigerant tank through the vapor outlet, and the condensed liquid descending from the heat radiator flows into the refrigerant tank through the liquid inlet. As a result, there is no interference between the boiling vapor and the condensed liquid, and the boiling vapor can smoothly flow out of the refrigerant tank.

The refrigerant flow control plate may be slanted at the upper part within the refrigerant tank, or the refrigerant flow control plate may extend from the upper part to the inside of the refrigerant tank.

The refrigerant flow control plates may extend in the generally vertical direction on each side of an area corresponding to the mounting location of the heating body. That is, within the refrigerant tank, as the refrigerant is boiled mainly at an area corresponding to the mounting location of the heating body, by providing the refrigerant flow control plates on each side of such area, the interference between the boiled boiling vapor and the condensed liquid descending therefrom can be effectively prevented.

When ascending within the refrigerant tank, the boiled boiling vapor may pass through a plurality of passages and is introduced into the vapor outlet. As a result, the disturbance of the boiling vapor can be prevented (rectified) and the boiling vapor can smoothly exit upward.

When the plurality of passages are defined by fins disposed within the refrigerant tank, the heat radiation area is increased by the fin, the heat radiability being thereby expected. Furthermore, the fins are disposed in contact with the inside wall surface of the refrigerant tank and function as ribs supporting the wall surface of the refrigerant tank, the wall surface of the refrigerant tank can be reinforced.

When the refrigerant flow control plate is integrally formed with the thin plate composing the refrigerant tank by pressing, the manufacturing cost can be reduced.

When the inside of the refrigerant tank is partitioned in the thickness direction by the thin refrigerant flow control plate, the flow of the boiling vapor and the flow of the condensed liquid can be clearly separated.

When the refrigerant flow control plate includes the upper part to guide the condensed liquid descending from the heat radiator into the liquid inlet, the boiling vapor and the condensed liquid can be separated more smoothly.

When the tip end of the protrusion part provided on the refrigerant flow control is in contact with the inside wall surface of the refrigerant tank, the protrusion part functions as a rib to reinforce the wall surface of the refrigerant tank. Furthermore, as the heat radiation area is increased by the protrusion part in contact with the inside wall surface of the refrigerant tank, the heat radiability can be improved by the increase in the heat radiation area.

BRIEF DESCRIPTION OF THE DRAWINGS

Other objects, features and characteristics of the present invention as well as the functions of related parts will become more clear from a study of the following detailed description, the appended claims, and the drawings. In the accompanying drawings:

FIG. 30 is a cross sectional view taken along the line XXX—XXX of FIG. 29.

DETAILED DESCRIPTION OF THE PREFERRED EMBODIMENTS

Preferred embodiments of a cooling apparatus using boiling and condensing refrigerant according to the present invention will now be described with reference to the appended drawings.

A first embodiment of the present invention is described.

Figure 1:
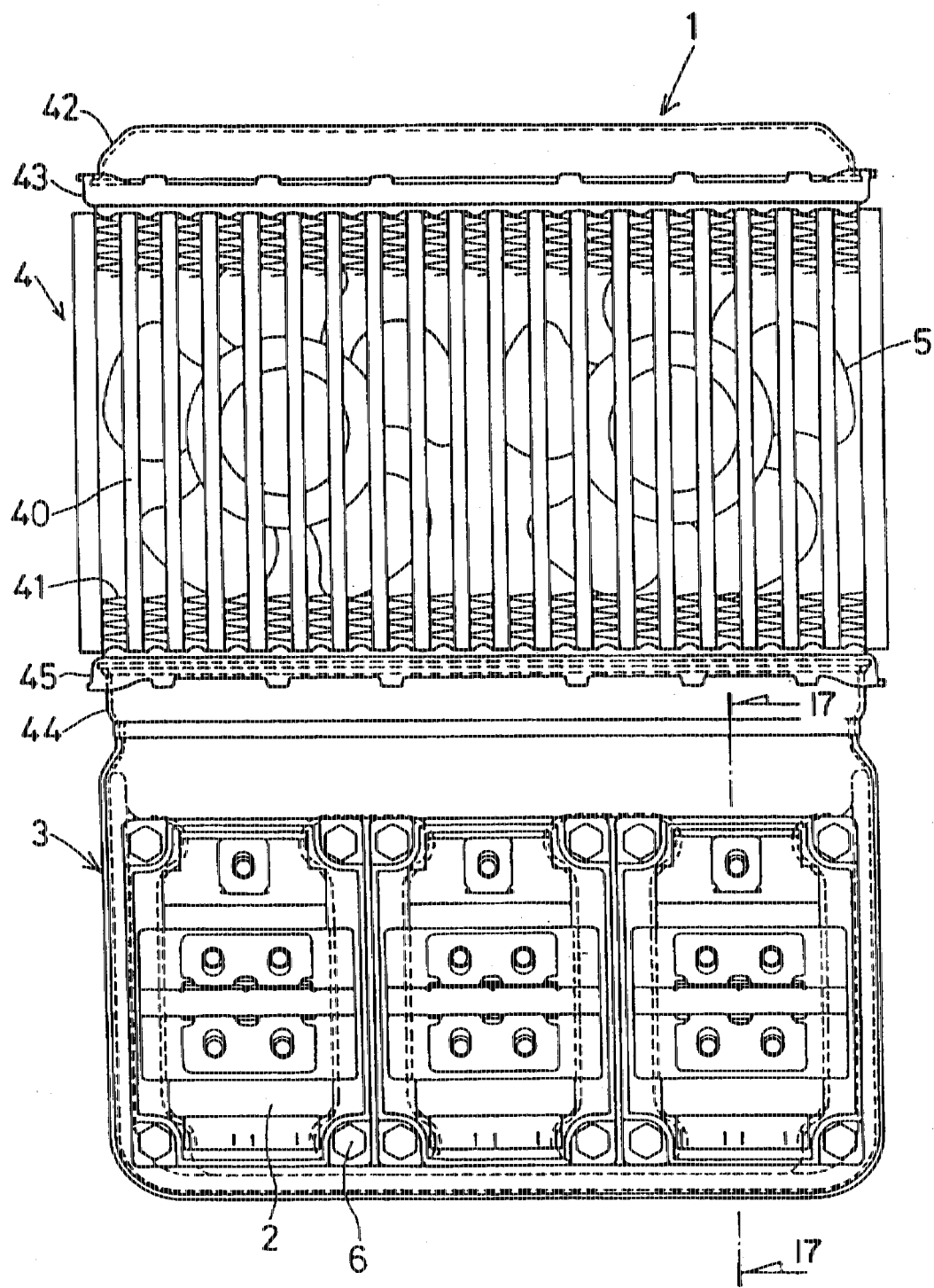
FIG. 1 is a front view illustrating a cooling apparatus of a first embodiment.
Figure 2:
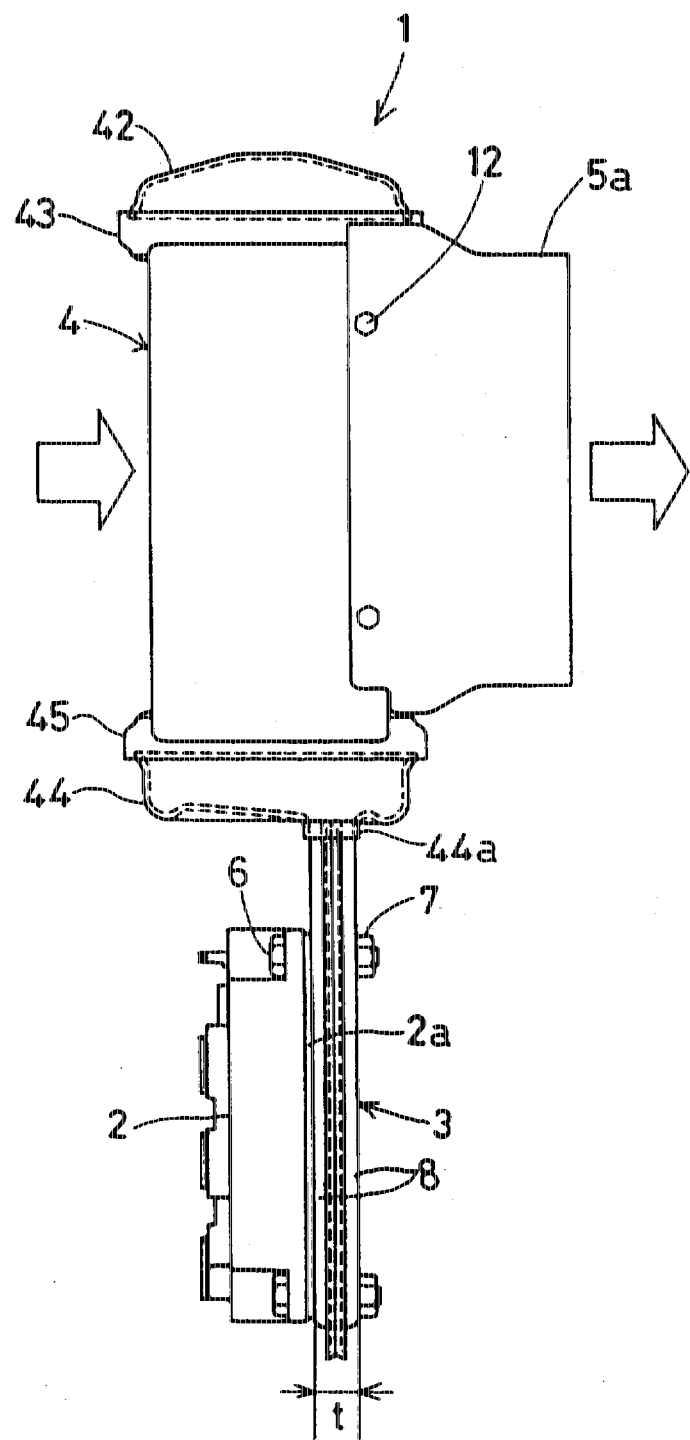
FIG. 2 is a side view illustrating the cooling apparatus of the first embodiment.

In FIGS. 1 and 2, a cooling apparatus using boiling and condensing refrigerant 1 is applied to IGBT (Insulated Gate Bipolar Transistor) modules 2 composing an inverter circuit (not illustrated) of an electric vehicle. The cooling apparatus comprises a refrigerant tank 3 watertightly containing phlorocarbonic type refrigerant therein, a heat radiator 4 disposed above the refrigerant tank 3 and a cooling fan 5 which blows cooling air to the heat radiator 4.

The IGBT module 2 has a heat radiation plate 2a which radiates the heat generated at a built-in semiconductor element (not illustrated). The heat radiating plate 2a is closely adhered to the outer wall surface of the refrigerant tank 3 through heat-conductive grease (not illustrated) and fixed to the refrigerant tank 3 by fastening bolts 7 and nuts 6 (FIG. 2).

The refrigerant tank 3 consists of a couple of pressed plates 8 having a generally rectangular shape, and is so provided as to be as thin having a thickness "t" (FIG. 2) of approximately 12 mm.

Figure 3:
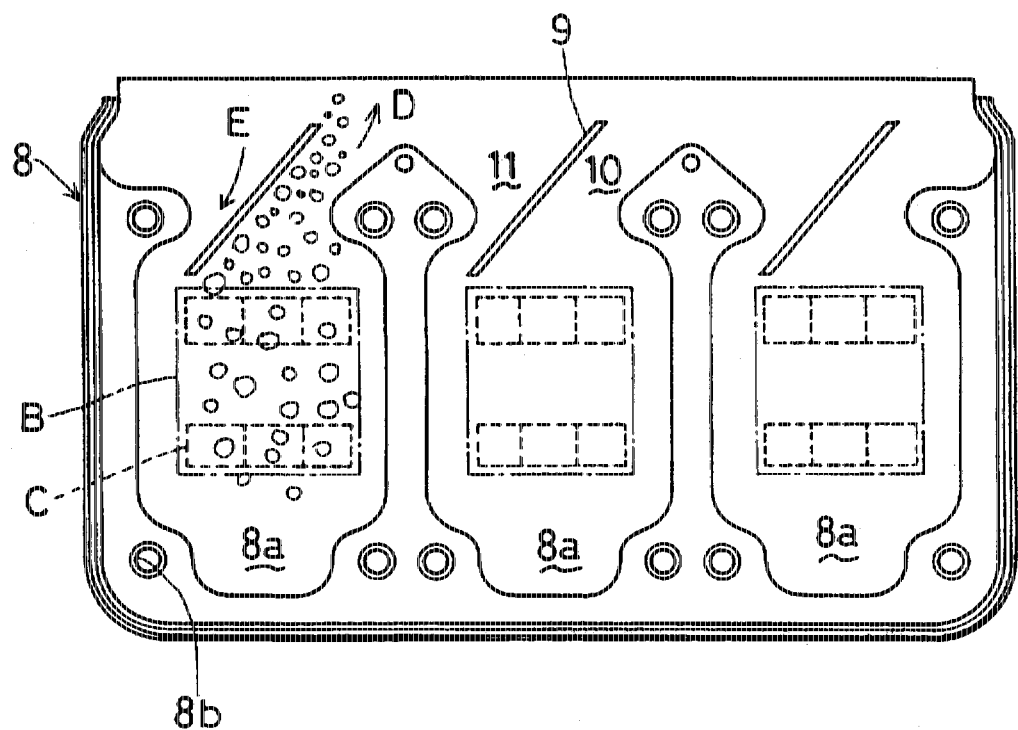
FIG. 3 is a plan view illustrating a pressed plate of the first embodiment.
Figure 4:
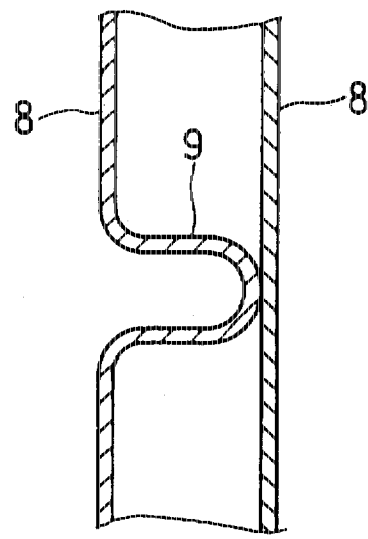
FIG. 4 is a cross-sectional view illustrating a pressed plates forming a guide plate of the first embodiment.
Figure 5:
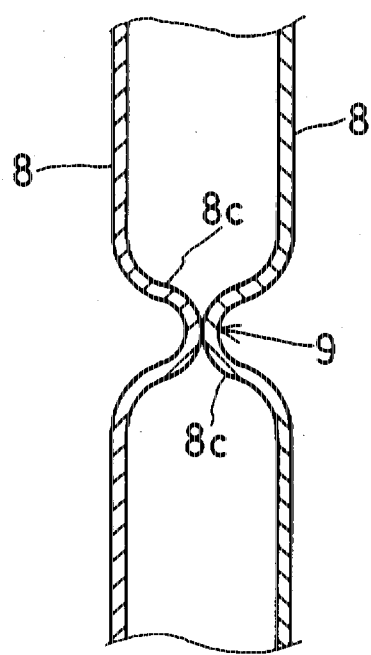
FIG. 5 is a cross-sectional view illustrating a modification of the pressed plates forming the guide plate of the first embodiment.

The pressed plate 8 is formed by pressing an aluminum plate having a thickness of approximately 1.6 mm. As illustrated in FIG. 3, a shallow recessed part 8a is formed at each of three locations in the width direction of the plate 8 (left and right direction in FIG. 3) to contain the refrigerant. The entrance of each recessed part 8a is narrowed in the width direction of the pressed plate 8. Bolt holes 8b through which bolts 7 are inserted are provided around each recessed part 8a.

On the pressed plate 8, a guide plate 9 is provided at the entrance of each recessed part 8a. The guide plate 9 is diagonally disposed at the entrance of each recessed part 8a as illustrated in FIG. 3 to form a vapor outlet 10 through which boiling vapor flows out and a liquid inlet 11 through which condensed liquid flows in at the entrance of the refrigerant tank 3 by coupling the pressed plates 8.

The guide plates 9 may be formed by inserting a separate aluminum plate between the couple of pressed plates 8 and integrally fixed by brazing. However, the guide plates 9 may also be integrally formed with the pressed plates 8 by pressing. In this case (by pressing), the guide plates 9 may be provided on only one side of the pressed plate 8 or by putting the respective protrusion part 8c pressed on both the press molded plates 8 together to form the guide plate 9.

The heat radiator 4 comprises heat radiation tubes 40, an upper tank part and a lower tank part (described below) and corrugate fins 41.

The heat radiation tubes 40 is made of flat aluminum tubes.

The upper tank part comprises a combination of an upper tank 42 and an upper plate 43. The upper end part of each heat radiation tube 40 is inserted to the upper plate 43.

The lower tank part comprises a combination of a lower tank 44 and a lower plate 45. The lower end part of each heat radiation tube 40 is inserted to the lower plate 45. An insertion opening 44a (FIG. 2), into which the upper end opening part of the refrigerant tank 3 is inserted, is provided at the bottom of the lower tank 44. Here, the upper tank 42, the upper plate 43, the lower tank 44 and the lower plate 45 are made of aluminum plates having a thickness of approximately 1.6 mm, these aluminum plates are produced by pressing.

The respective corrugate fin 41 is interposed between each pair of the adjacent heat radiation tubes 40 and fixed in contact with the outer wall surface of the heat radiation tubes 40. The radiating ability of the corrugate fin 41 can be improved by enlarging the surface area of the heat radiator 4 and increasing the heat conductivity.

The heat radiator 4 is manufactured by integrally brazing with the refrigerant tank 3 while the heat radiator 4 and the refrigerant tank 3 are assembled to each other.

The cooling fan 5 is of axial flow type and disposed on the front side (or the rear side) of the heat radiator 4 and fixed to the side surface of the heat radiator 4 through a fan shroud 5a using bolts 12 (FIG. 2). Here, the cooling fan 5 may be of an suction type and disposed on the downstream side of the heat radiator 4 with respect to the air blow direction (the air blow direction in this embodiment is indicated with arrows in FIG. 2) or of a thrust-in type and disposed on the upstream side of the heat radiator 4 with respect to the air blow direction.

An operation of the cooling apparatus 1 using boiling and condensing refrigerant of this embodiment will now be described.

When the semiconductor element in the IGBT module 2 generates heat, the heat is transferred to the heat radiating plate 2a, and further to the pressed plates 8 composing the refrigerant tank 3 through the heat conductive grease, and the refrigerant contained in the refrigerant tank 3 is boiled by the transferred heat. Here, the IGBT module 2 is mounted to each recessed part 8a (the mounting location of each IGBT module 2 is indicated with dot-dash line in FIG. 3), and the semiconductor element built in each IGBT module 2 is mounted approximately in the location indicated with broken line C in FIG. 3.

The refrigerant contained in each refrigerant tank 3 boils in the area including the location where the semiconductor element is mounted, i.e., the area indicated with the broken line C in FIG. 3. The boiled refrigerant ascends within the refrigerant tank 3 in the form of air bubbles, flows out of the refrigerant tank 3 through the vapor outlet 10 formed by the guide plate 9, as indicated with the arrow D in FIG. 3, and then flows into the lower tank part of the heat radiator 4. The air bubbles are further distributed from the lower tank part of the heat radiator 4 to each heat radiation tube 40, and then ascends therewithin. The refrigerant vapor flowing within the heat radiator tubes 40 is condensed on the inner wall surface of the heat radiation tubes 40 and liquefied, and flows down within the heat radiation tubes 40 by the self-weight thereof, and returns into the refrigerant tank 3 through the lower tank part. On the other hand, the condensation latent heat released when the refrigerant vapor is condensed transfers through the tube walls of the heat radiation tubes 40 to the corrugate fins 41 and discharged to the atmosphere by the air generated by the cooling fan 5.

The condensed liquid flowing down within the refrigerant tank 3 flows into the refrigerant tank 3 through the liquid inlet 11 formed by the guide plate 9, as indicated with arrow E in FIG. 3. As the air bubbles ascending within the refrigerant tank 3 and the condensed liquid flowing into the refrigerant tank 3 are thus separated from each other by the guide plate 9 provided at the entrance of the refrigerant tank 3 (the recessed part 8a), the air bubbles and the condensed liquid can smoothly flow without mutual interfering, and the refrigerant preferably circulates within the refrigerant tank 3.

In this embodiment, as the interference within the refrigerant tank 3 between the boiling vapor (air bubbles) and the condensed liquid is reduced, the refrigerant vapor can easily exit upward out of the refrigerant tank 3, and as a result, the circulation of the refrigerant (exchange of the boiling vapor with the condensed liquid) within the refrigerant tank 3 can smoothly be accomplished. Consequently, the maximum heat delivery quantity by the boiling and condensation heat transfer of the refrigerant increases, and the heat radiability can be improved as much as the increment.

In the cooling apparatus 1 of the first embodiment, the boiling vapor ascending out of the refrigerant tank 3 is distributed from the lower tank part of the heat radiator 4 into each heat radiation tube 40. That is, the heat radiator 4 is so constructed as to send boiling vapor not only to the specific heat radiation tubes 40 but to all the heat radiation tubes 40. It is prevented that a large pressure loss is caused as seen in the conventional apparatus in which boiling vapor is sent only to the specified heat radiation tubes, and therefore, it is prevented that the temperature distribution of the heat radiator 4 is uneven. As a result, the heat radiator 4 can be used more efficiently in comparison with the conventional apparatus, the heat radiability can be thereby improved.

In the cooling apparatus 1 of the first embodiment, since three IGBT modules 2 are mounted, the refrigerant tank 3 is divided into three parts corresponding to the three respective IGBT modules 2, however, each respective refrigerant tank 3 (i.e., the recessed part 8a) may be provided independently from others or communicated with others. Further, the size of the refrigerant tank 3 (i.e., the size of the pressed plate 8) may be modified according to the number of the IGBT modules 2 to be mounted.

Since the refrigerant tank 3 is formed by putting together at least a couple of thin plate materials (pressed plates 8), the refrigerant tank 3 can easily be formed. Furthermore, since the guide plate 9 partitioning the entrance of the refrigerant tank 3 into the vapor outlet 10 and the liquid inlet 11 is composed of the long and narrow aluminum plate and the vapor outlet 10 and the liquid inlet 11 is structured by the couple of pressed plates 8 composing the refrigerant tank 3, the material volume can be saved and the cost can be reduced. In addition, since the guide plate 9 is disposed within the refrigerant tank 3 so as to contact both the pressed plate 8 facing each other, the guide plate 9 can be fixed very easily when the pressed plates 8 are putted together.

Furthermore, since the guide plate 9 is in contact with the thin plate material on the side to which the heat generating body is fixed, the heat from the heat generating body can be transferred to the refrigerant even through the guide plate 9 by means of heat transfer. As a result, a highly efficient heat radiability can be obtained.

A second embodiment of the present embodiment will be described with respect to FIG. 6.

The second embodiment is different from the first embodiment in that the shape and layout of the guide plate 9 is modified.

Figure 6:
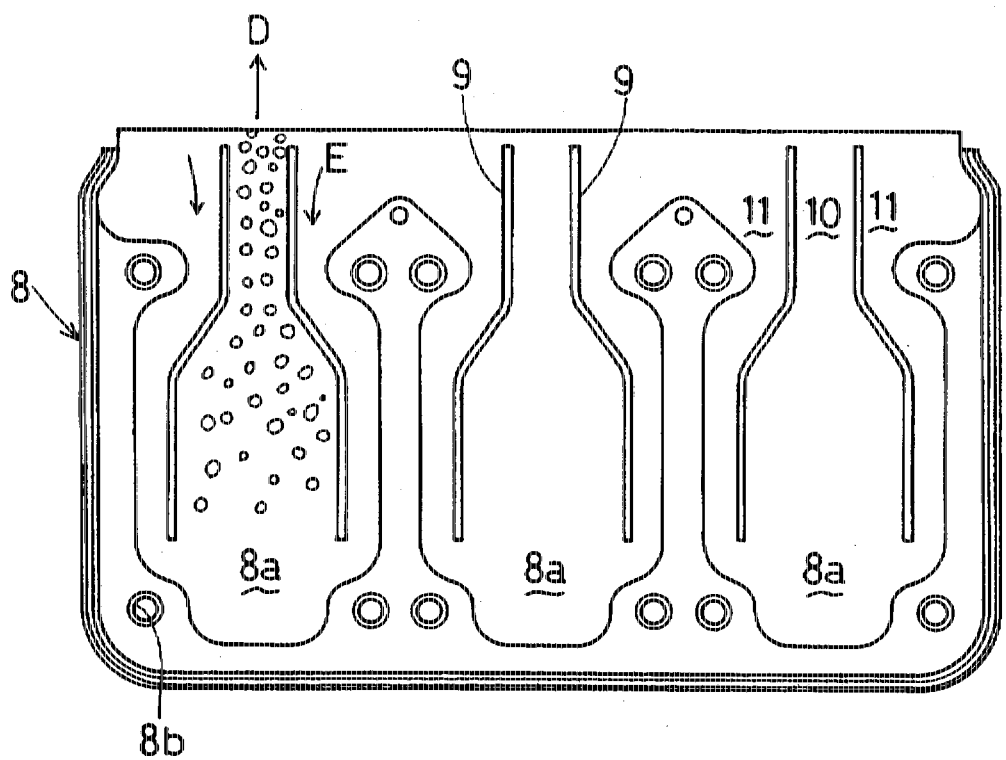
FIG. 6 is a plan view illustrating a pressed plate of a second embodiment.

Specifically, as illustrated in FIG. 6, a pair of strip guide plates 9 extend in the roughly vertical direction on the both sides of the area including the semiconductor element mounting location (the area indicated with broken line C in FIG. 3) from the proximity of the upper end of the refrigerant tank 3 to the lower part side of the refrigerant tank 3. The pair of guide plates 9 forms the liquid inlet 11 above the refrigerant tank 3 the vapor outlet 10 in the central part of the refrigerant tank 3.

According to the present invention, as the pair of guide plates 9 can separate the flow of the boiling vapor from the flow of the condensed liquid more clearly, the interference between the boiling vapor and the condensed liquid can further be reduced, and the heat radiability can be improved accordingly.

A third embodiment of the present invention will be described with respect to FIGS. 7 to 9.

Figure 7:
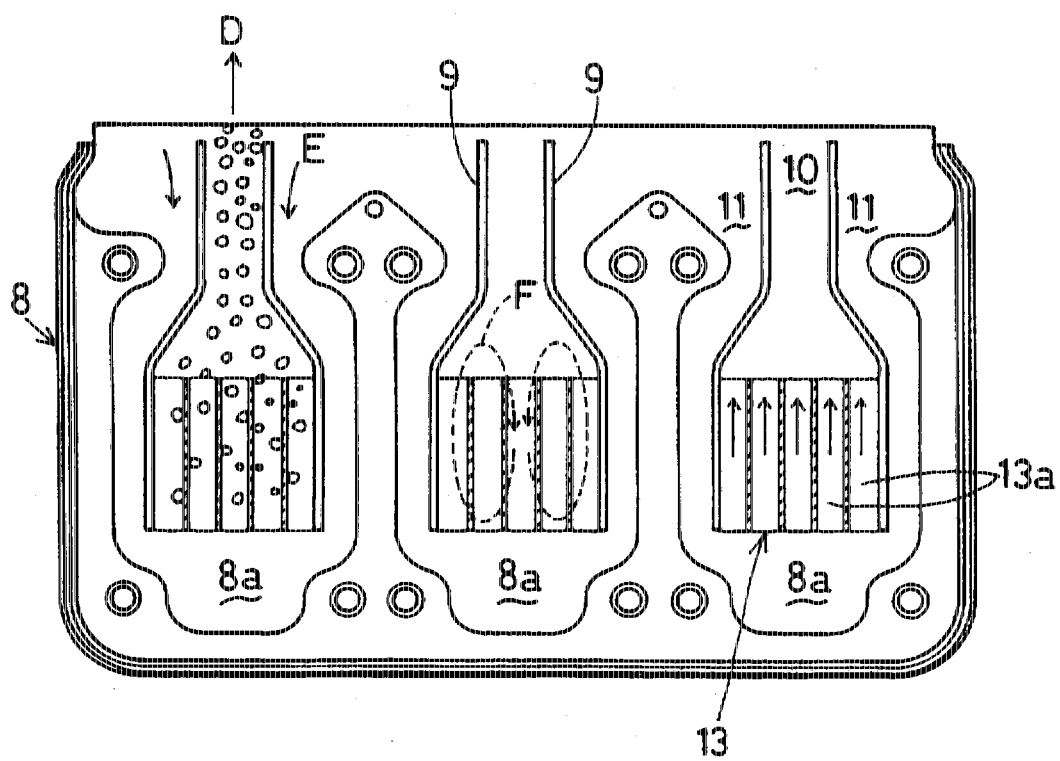
FIG. 7 is a plan view illustrating a pressed plate of a third embodiment.

In this embodiment, as shown in FIG. 7, inner fins 13 are inserted in the area (between the pair of guide plates 9) including the semiconductor element mounting location described in the second embodiment.

Figure 8:
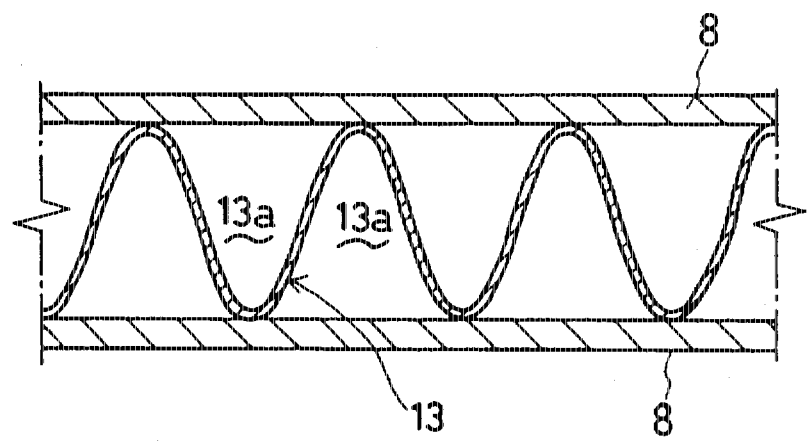
FIG. 8 is a cross-sectional view illustrating the mounted condition of inner fins of the third embodiment.
Figure 9:
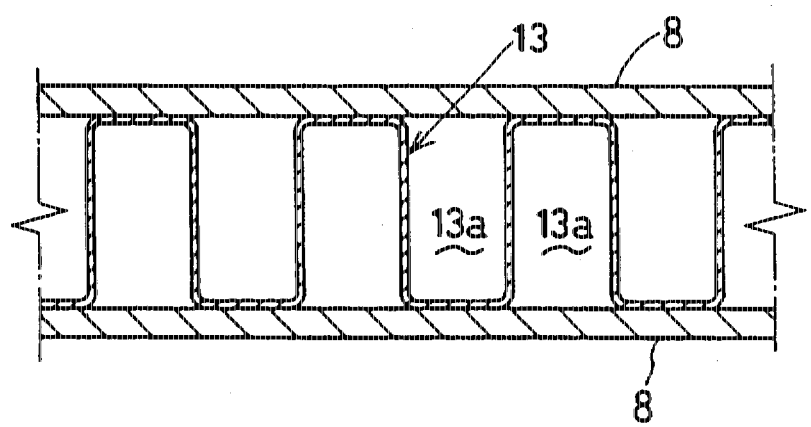
FIG. 9 is a cross-sectional view illustrating the mounted condition of a modification of the inner fins of the third embodiment.

For the inner fins 13, wavingly bent corrugate fins as illustrated in FIG. 8, rectangularly bent waved rectangular corrugate fins as illustrated in FIG. 9, or otherwise may be used.

By inserting the inner fins 13 into the vapor outlet 10, the flow of the air bubbles generated by boiling can be smoothened. If the inner fins 13 are not provided, the air bubbles ascending inside the guide plates 9 strike the slant surface of the guide plates 9 and turn to the central part side, and bump the air bubbles ascending in the central part, thereby disturbing the flow of the air bubbles. If the inner fins 13 are provided, however, as the inner fins 13 divide the space between the pair of guide plates 9 into a plurality of passages 13a (FIGS. 8 and 9), the air bubbles generated by boiling can ascend through the respective passages 13a as illustrated with solid arrow lines in FIG. 7. In this way, the flow of the air bubbles is guided in a predetermined direction, even if the air bubbles flowing inside the guide plates 9 strike the slant surface of the guide plates 9, the air bubbles can easily and smoothly ascend and exit upward by the flow smoothening effect of the inner fins 13.

In addition, in this embodiment, as the heat radiation area is enlarged by using the inner fins 13, the heat generated at the semiconductor element transfers to the refrigerant more quickly, and as a result, the heat radiability can be improved.

Furthermore, as illustrated in FIGS. 8 and 9, as the side surfaces of the inner fins 13 are in contact with the inner wall surfaces of each pressed plate 8, the inner fins 13 function as reinforcement ribs of the refrigerant tank 3.

That is, when the refrigerant tank 3 is composed of the thin (approximately 1.6 mm) pressed plates 8 according to this embodiment, the pressed plates 8 may be deformed (distorted) due to lack of rigidity, however, such deformation (distortion) of the pressed plates 8 can be prevented by reinforcing the rigidity of the pressed plates 8 by providing the inner fins 13. If the pressed plates 8 are distorted due to the lack of the rigidity, the contact thermal resistance between the IGBT modules 2 and the pressed plates 8 increases, and as a result, the heat conductivity decreases and the heat radiability deteriorates. Therefore, by preventing the pressed plates 8 from being deformed by the inner fins 13, the deterioration in the heat radiability caused by the decrease in the heat conductivity can be prevented.

A fourth embodiment of the present invention will be described with respect to FIG. 10 as below.

Figure 10:
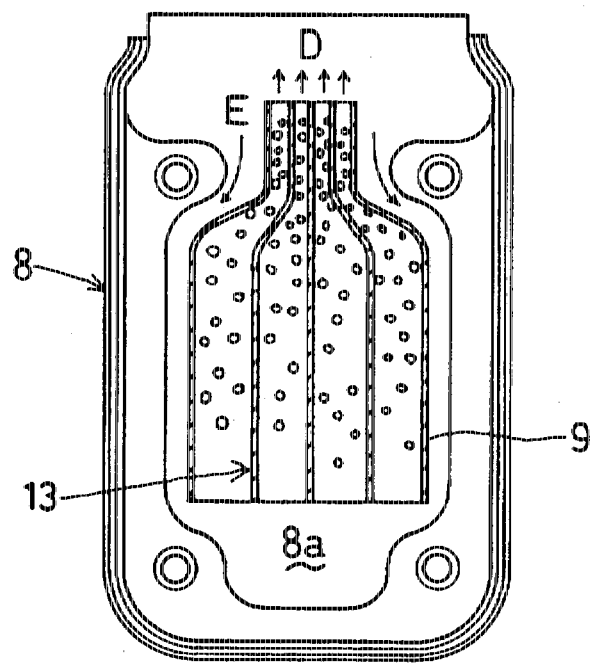
FIG. 10 is a plan view illustrating a pressed plate of a fourth embodiment.

FIG. 10 is a plan view illustrating the pressed plate 8 according to the fourth embodiment.

As described in the first embodiment, when the entrance and exit of the refrigerant tank 3 (the recessed part 8a) is narrowed in the breadth direction of the pressed plate 8, the vapor outlet 10 formed by the pair of guide plates 9 is naturally narrowed. In the fourth embodiment, the inner fins 13 are extended up to the vapor outlet 10, and the fin pitch at the vapor inlet 10 is set to be smaller. In this way, the flow smoothening effect by the inner fins 13 is improved so that the air bubbles can exit more smoothly.

FIG. 10 illustrates the shape of the pressed plate 8 on which only one IGBT module 2 is mounted, however, the fourth embodiment can be applied to the pressed plates 8 to which a plurality of IGBT modules 2 are mounted.

A fifth embodiment of the present invention is described as below.

In the fourth embodiment, the entrance and exit of the refrigerant tank 3 (the recessed part 8a) is narrowed. However, if the pressed plate 8 has enough space, it is not always necessary for the entrance of the refrigerant tank 3 to be narrowed, and it is preferable that the entrance and exit of the refrigerant tank 3 should not be narrowed, as illustrated in FIGS. 11 to 15.

Figure 11:
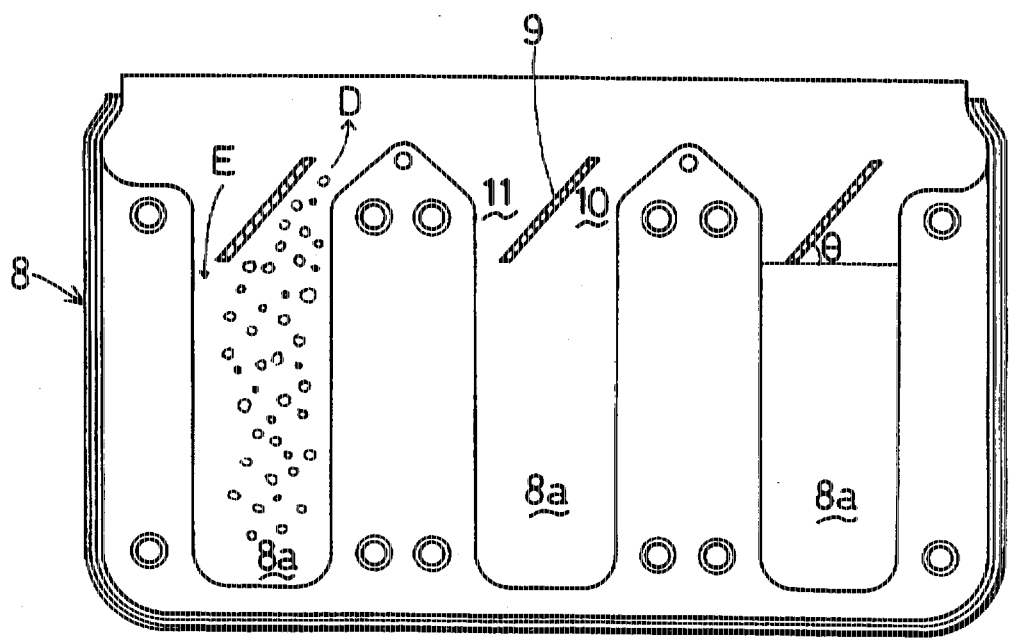
FIG. 11 is a plan view illustrating a pressed plate of a fifth embodiment.

As illustrated in FIG. 11, the guide plates 9 can be slantly disposed at the upper part in the refrigerant tank 3 (the recessed part 8a). In such a structure, as long as the vapor outlet 10 and the liquid inlet 11 are formed, the same effect as those described above can be obtained as well regardless of the disposition angle θ of the guide plates 9.

Figure 12:
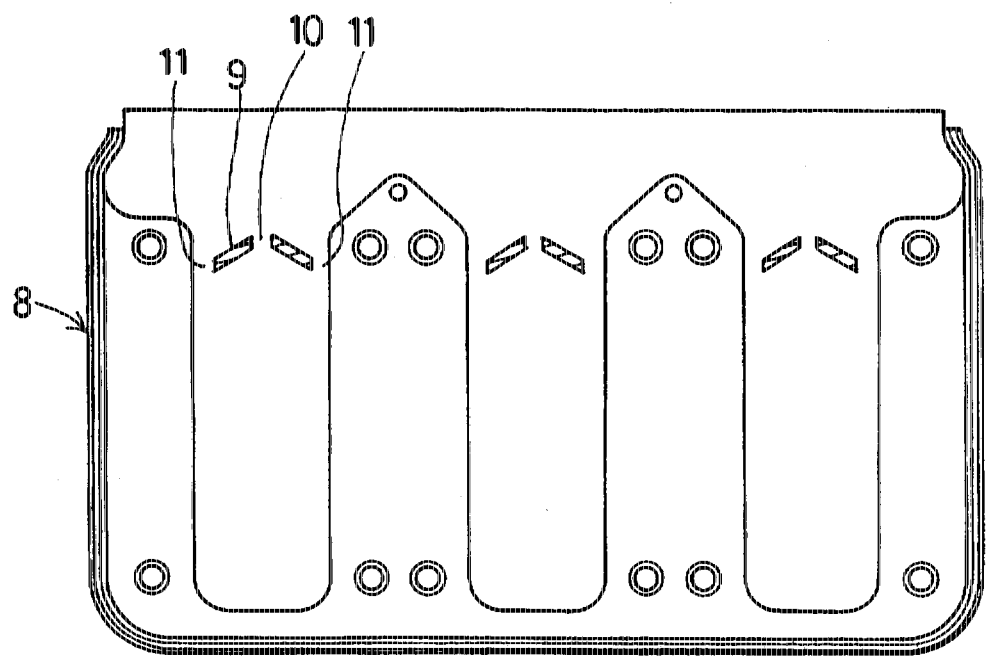
FIG. 12 is a plan view illustrating a modification of the pressed plate of the fifth embodiment.

Further, as illustrated in FIG. 12, the vapor outlet 10 and the liquid inlet 11 can be formed by a plurality of guide plates 9 (two guide plates 9 in FIG. 12) slantly disposed in the entrance and exit of the refrigerant tank 3. In such a structure, the same effect as those described above can be obtained as well.

Figure 13:
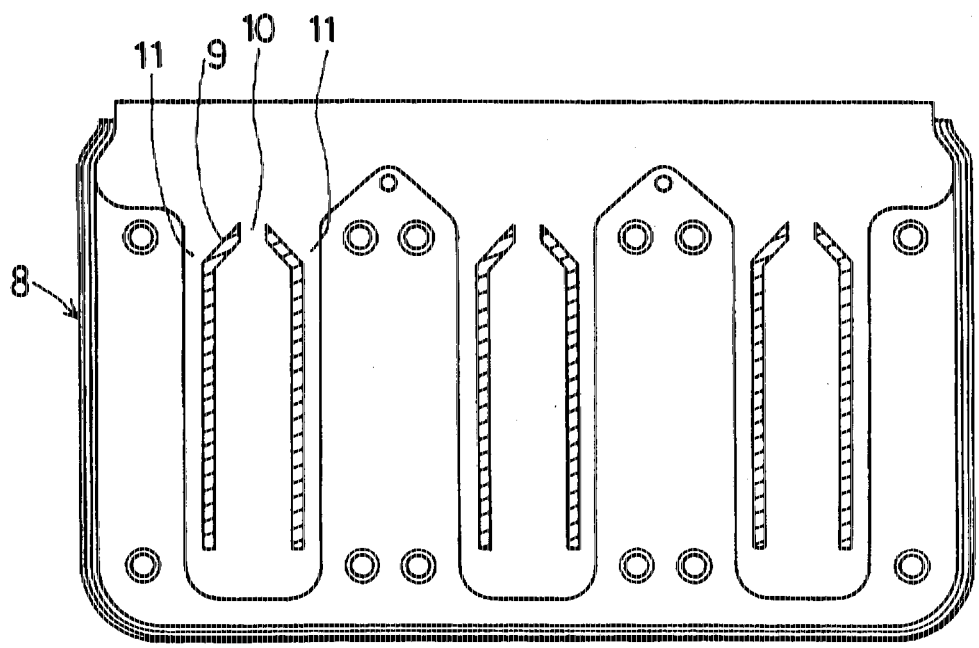
FIG. 13 is a plan view illustrating another modification of the pressed plate of the fifth embodiment.

FIG. 13 illustrates a modification in which the guide plates 9 are disposed to extend along both sides of the area corresponding to the heat generating body mounting location from the upper part to inner part of the refrigerant tank 3 to form the vapor outlet 10 and the liquid inlet 11. In such a structure, the same effect as those described above can be obtained as well.

Figure 14:
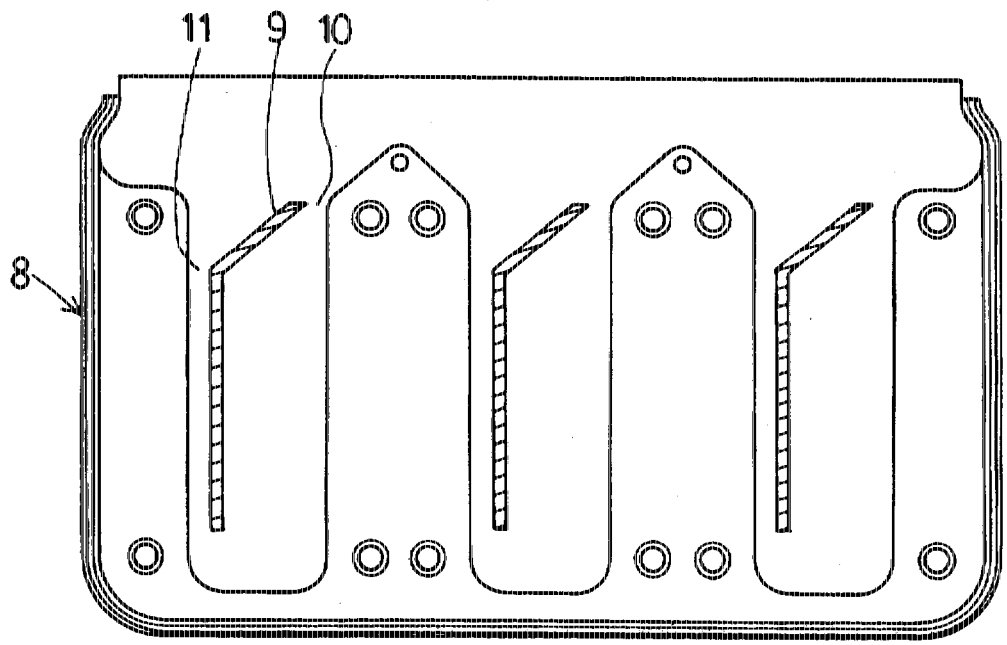
FIG. 14 is a plan view illustrating still another modification of the pressed plate of the fifth embodiment.
Figure 15:
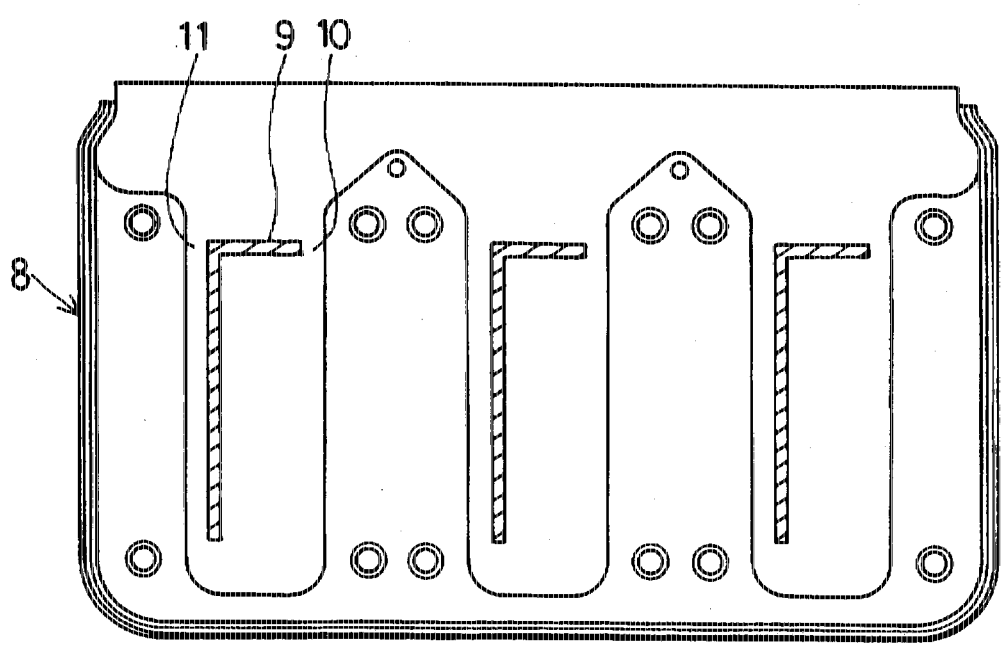
FIG. 15 is a plan view illustrating further another modification of the pressed plate of the fifth embodiment.

FIGS. 14 and 15 illustrate modifications in which one guide plate 9 is disposed to extend from the upper part to inner part of the refrigerant tank 3 to form the vapor outlet 10 and the liquid inlet 11. The guide plate 9 may be slantly disposed within the upper portion of the refrigerant tank 3 as illustrated in FIG. 14 or may have a part 9a generally extending in a horizontal direction within the upper portion of the refrigerant tank 3.

A sixth embodiment will be described as below.

Figure 16:
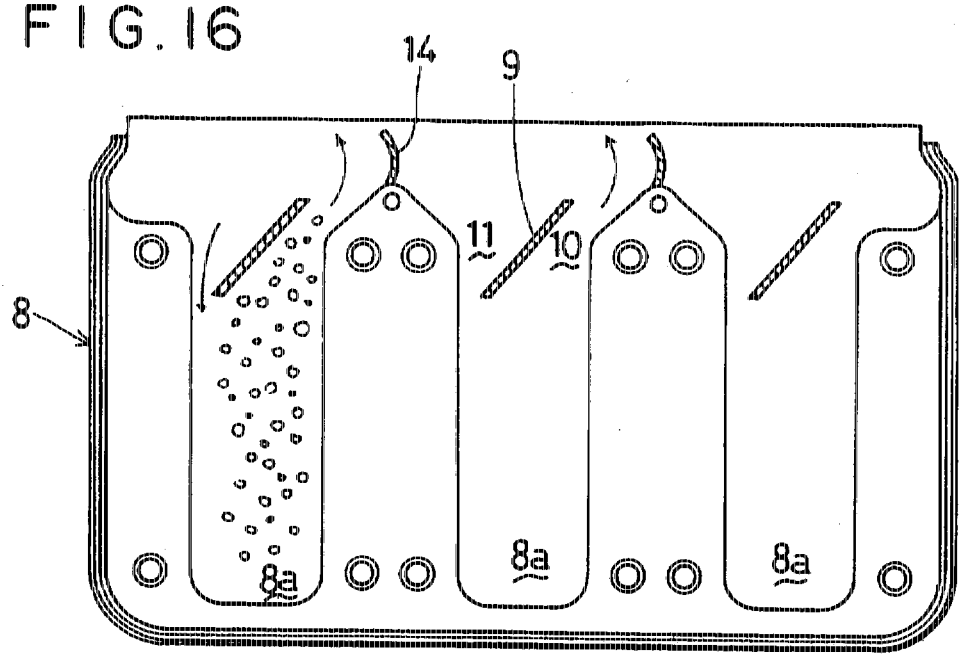
FIG. 16 is a plan view illustrating a pressed plate of a sixth embodiment.

In the sixth embodiment, a curved supplementary guide plate 14 is provided between the adjoining refrigerant tanks 3 (the recessed part 8a) as illustrated in FIG. 16. When the guide plates 9 is slantly disposed at the entrance and exit of the refrigerant tank 3 as illustrated in FIG. 11, the flow of the air bubbles may be deflected to one side (the left side in FIG. 16) throughout the refrigerant tank 3. This deflection is corrected by providing the supplementary guide plate 14, the air bubbles can be thereby diffused more uniformly.

A seventh embodiment is described with respect to FIG. 17 as below.

Figure 17:
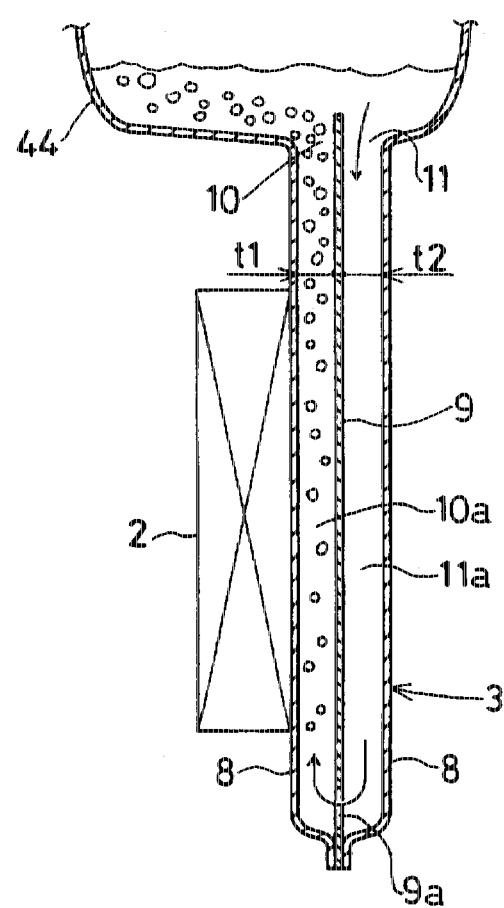
FIG. 17 is a cross-sectional view illustrating a refrigerant tank of a seventh embodiment.

FIG. 17 is a cross-sectional view corresponding to that taken along line A—A of FIG. 1.

In the seventh embodiment, the refrigerant tank 3 is partitioned in the thickness direction thereof into two sections by the guide plate 9, wherein the upper part of the refrigerant tank 3 on the side to which the IGBT module 2 is mounted constitutes the vapor outlet 10 and the opposite side constitutes the liquid inlet 11. A communication opening 9a is provided at lower part of the guide plate 9 to communicate both sides of the guide plate 9. In such a structure, the refrigerant, which boils by absorbing the heat from the semiconductor element, ascends in the form of air bubbles through a passage 10a on the side of the vapor outlet 10 and exits therefrom into the heat radiator 4. On the other hand, the condensed liquid, which is cooled and liquefied within the heat radiator 4, flows from the lower tank part to the liquid inlet 11, descends through a passage 11a on the side of the liquid inlet 11, passes through the communication opening 9a of the guide plate 9, and flows into the side of the vapor outlet 10.

The guide plate 9 can not be integrally formed with the pressed plates 8 by pressing. However, as the guide plate 9 can be inserted between the couple of pressed plates 8 and brazed thereto, the guide plate 9 can be manufactured with relatively low cost and be mounted easily.

In this embodiment, as the refrigerant tank 3, which is originally designed to be thin, is partitioned in the thickness direction thereof into two sections by the guide plate 9, the thickness of the passage 10a on the side of the vapor outlet 10 and the thickness of the passage 11a on the side of the liquid inlet 11 can be made narrow. Therefore, in order for the air bubbles to smoothly flow out, it is preferable that the thickness t1 of the passage 10a should be made larger than the thickness t2 of the passage 11a.

An eighth embodiment of the present will be described below.

Figure 18:
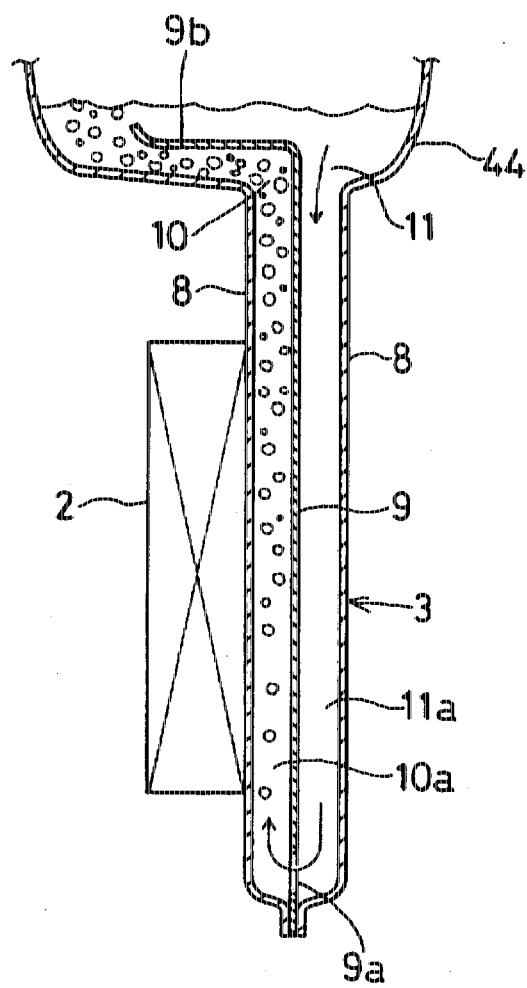
FIG. 18 is a cross-sectional view illustrating a refrigerant tank of an eighth embodiment.

FIG. 18 is a cross-sectional view corresponding to that taken along line A—A of FIG. 1.

In this embodiment, the upper end of the guide plate 9 described in the seventh embodiment is extended and bent to the side of the vapor outlet 10. In this way, the condensed liquid flowing downwards can be received at an extended part 9b of the guide plate 9 and guided thereby directly to the liquid inlet 11. As a result, the refrigerant can effectively circulate.

A ninth embodiment of the present invention will be described below.

Figure 19:
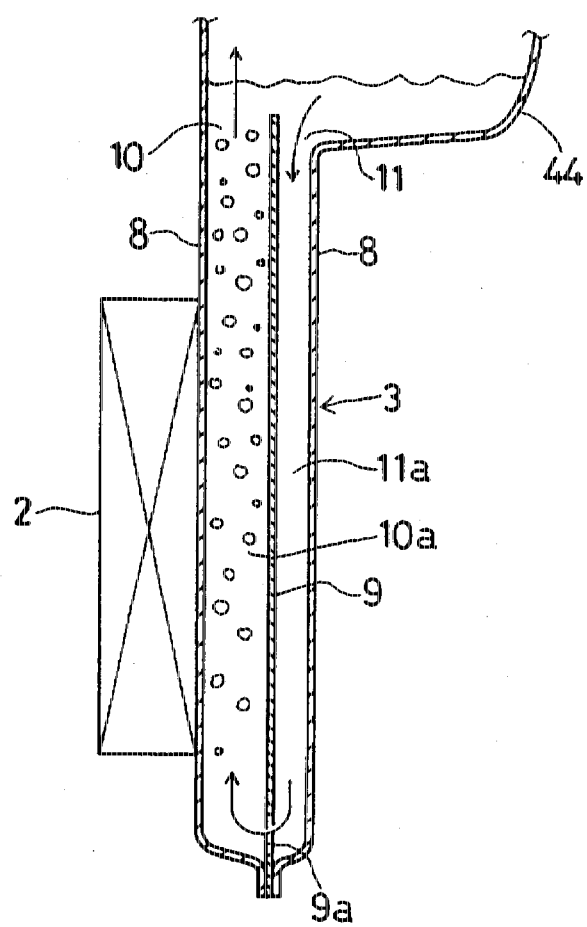
FIG. 19 is a cross-sectional view illustrating a refrigerant tank of a ninth embodiment.

FIG. 19 is a cross-sectional view corresponding to that taken along line A—A of FIG. 1.

In this embodiment, the refrigerant tank 3 is partitioned in the thickness direction thereof into two sections by the guide plate 9 in the same way as the seventh and eighth embodiments. The refrigerant tank 3 is, however, connected to the lower tank part of the heat radiator 4 with the tank 3 deflected to the side of the IGBT modules 2 (the left side in FIG. 19).

In this embodiment, the bottom surface of the lower tank part of the heat radiator 4 functions as the extended part 9b of the guide plate 9 described in the eighth embodiment. Therefore, the guide plate 9 may have the same shape as that described in the seventh embodiment. (That is, it not necessary to extend and bend the upper end of the guide plate 9.)

A tenth embodiment will be described with respect to FIG. 20.

Figure 20:
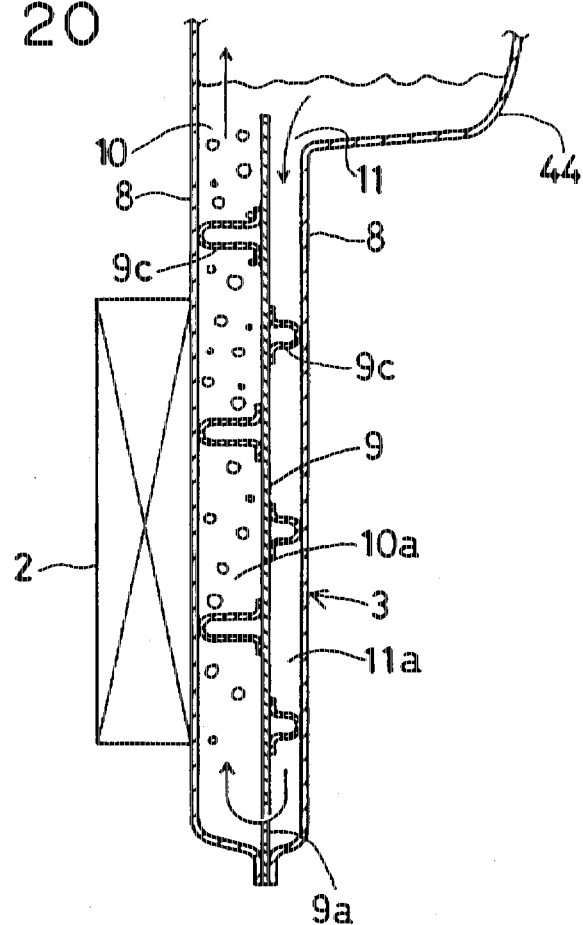
FIG. 20 is a cross-sectional view illustrating a refrigerant tank of a tenth embodiment.

FIG. 20 is a cross-sectional view corresponding to that taken along line A—A of FIG. 1.

In this embodiment, protrusion parts 9c is provided on the guide plate 9 to participate the refrigerant tank 3 in the thickness thereof into two sections, and the tip ends of the protrusion parts 9c are brazed while being in contact with the inner wall surface of the pressed plate 8. The protrusion parts 9c are formed by pressing separately from the guide plate 9 or integrally with the guide plate 9. The protrusion parts 9c are provided for a plurality in the passage 10a on the side of the vapor outlet and in the passage 11a on the side of the liquid inlet 11.

In such a structure, since each protrusion part 9c functions as a reinforcement rib of the pressed plate 8 in the same way as the inner fins 13 described in the third embodiment, the distortion of the pressed plate 8 can be prevented by reinforcing insufficient rigidity of the pressed plate 8. As a result, the increase in the contact thermal resistance due to the deformation of the pressed plate 8 can be prevented, and the deterioration of the heat radiability can be prevented. In addition, the heat radiability can be improved, because the radiation area is enlarged by providing the protrusion parts 9c.

Figure 21:
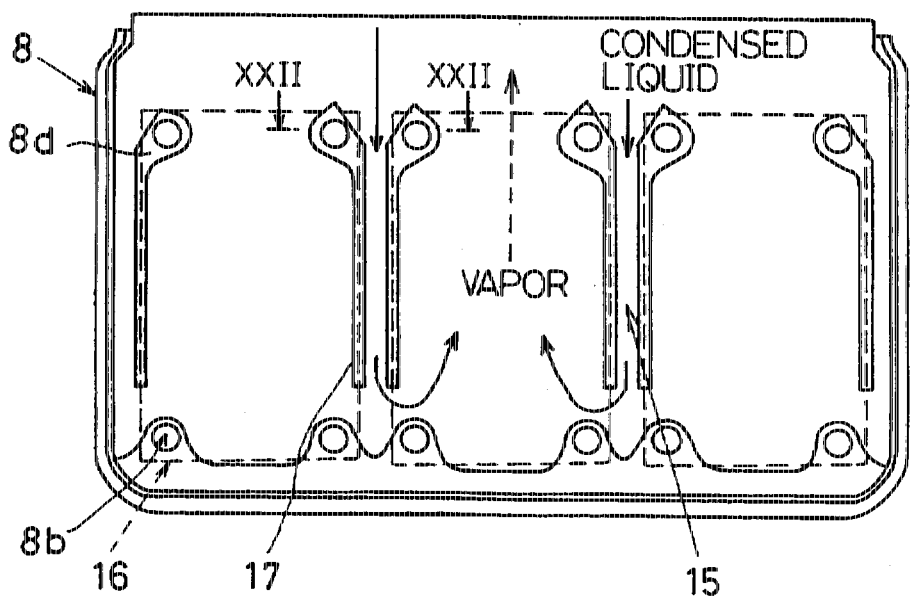
FIG. 21 is a plan view illustrating a pressed plate of an eleventh embodiment.

An eleventh embodiment will be described with respect to FIG. 21.

In this embodiment, the refrigerant supply passages 15 are provided to lead the condensed liquid, which was condensed and liquefied within the heat radiator 4, to the lower part side of the refrigerant tank 3. The refrigerant supply passages 15 are formed to extend in the vertical direction of the refrigerant tank 3 along the sides of the areas corresponding to the surface of mounting location of the IGBT modules 2 within the refrigerant tank 3, i.e., boiling areas 16 (the areas indicated with broken line in FIG. 21) in which the heat generation density of the refrigerant within the refrigerant tank 3 is high and the refrigerant boils by receiving the heat of the IGBT modules 2. The refrigerant supply passages 15 communicate with the boiling areas 16 at the lower part side of the refrigerant tank 3. Particularly when a plurality of IGBT modules 2 are arranged in the vertical direction of the refrigerant tank 3, as illustrated in FIG. 21, the refrigerant supply passages 15 can be formed between the adjacent boiling areas 16.

By forming the refrigerant supply passages 15 in the refrigerant tank 3 as described above, the interference between the boiling vapor which boils by receiving the heat from the IGBT modules 2 within the boiling areas 16 and the condensed liquid which flows downward from the heat radiator 4 is reduced, and as a result, the heat radiability is improved. (In FIG. 21, the flow of the boiling vapor is indicated with broken arrow line and the flow of the condensed liquid is indicated with full arrow line.) Within the refrigerant supply passage 15, the heat generation density and temperature of the refrigerant are lower than those within the boiling area. Accordingly, since the condensed liquid flowed into the refrigerant supply passages 15 can be supplied from the lower part of the refrigerant tank 3 to the boiling areas 16 with the temperature thereof being kept low, the circulation of the boiling vapor (of a high temperature) and the condensed liquid (of a low temperature) can circulate within the refrigerant tank 3 preferably, and as a result, cooling can effectively be performed.

Figure 22:
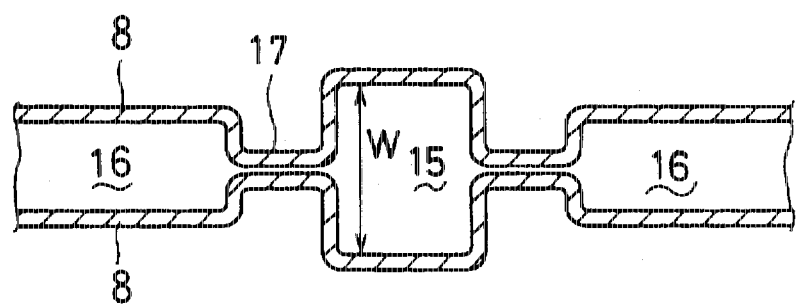
FIG. 22 is a cross-sectional view illustrating a refrigerant supply passage of the eleventh embodiment.

As illustrated in FIG. 22 (a cross-sectional view taken along line XXII—XXII of FIG. 21), the refrigerant supply passage 15 can be integrally provided by pressing with the couple of pressed plates 8 forming the refrigerant tank 3. Specifically, by forming passage walls 17 vertically extending in the refrigerant tank 3 to connect with fastening parts 8d at which the bolt holes 8b (through which the bolts 7 are inserted to mount the IGBT modules) are provided, the space partitioned by the adjacent two passage walls 17 can be provided as the refrigerant supply passage 15. Furthermore, as illustrated in FIG. 23, the refrigerant supply passages 15 may also be provided by interposing bar-shaped spacers 18 between the couple of pressed plates 8 facing each other.

In FIG. 22, a small clearance is formed between the passage walls 17 provided on the couple of pressed plates 8. The pair of passage walls 17, however, may be in contact with each other. In practical use, when the pair of passage walls 17 are in contact with each other to form the refrigerant supply passages 15 independently, the boiling area 16 and the refrigerant supply passage 15 can be securely separated. Therefore, the heat radiability is improved more effective.

Figure 23:
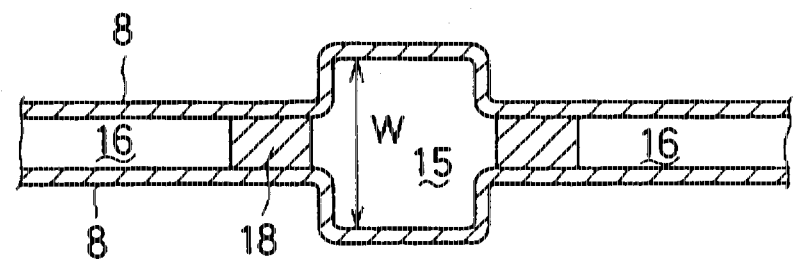
FIG. 23 is a cross-sectional view illustrating a modification of the refrigerant supply passage of the eleventh embodiment.

In addition, as illustrated in FIGS. 22 and 23, the condensed liquid can be introduced more effectively into the refrigerant supply passage 15 by setting the inner width W of the refrigerant tank 3 wider than that of the boiling areas 16 when the refrigerant supply passages 15 is formed. It is also advantageous for improving the heat radiability to set the inner width of the boiling areas 16 thinner than that of the refrigerant supply passages 15 because the heat transfer can be performed more efficiently between the IGBT modules 2 and the refrigerant.

Figure 24:
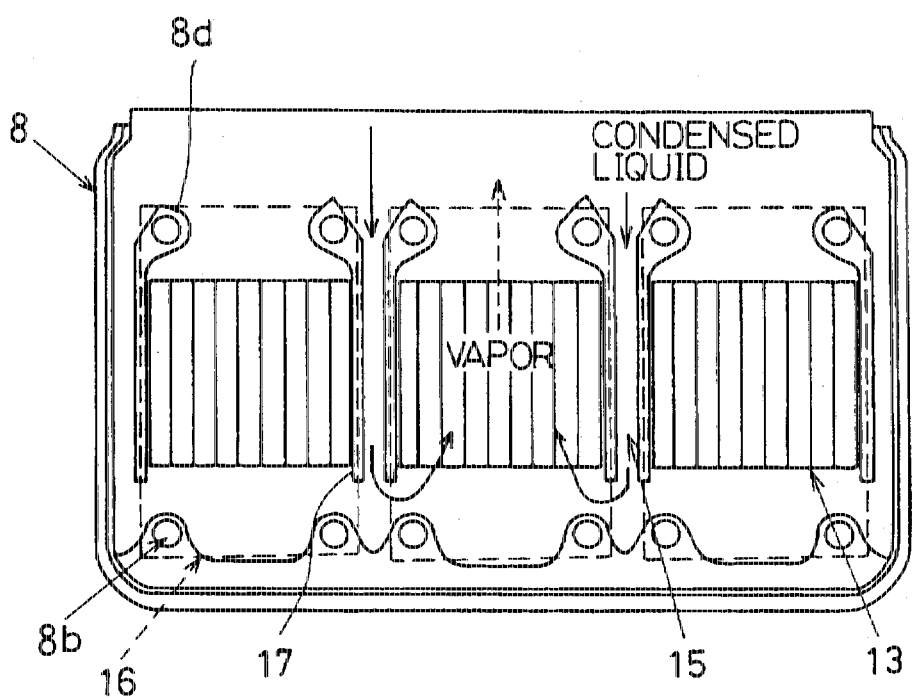
FIG. 24 is a plan view illustrating a pressed plate of a twelfth embodiment.

A twelfth embodiment will be described with respect to FIG. 24.

In this embodiment, the inner fins 13 are inserted into the boiling area 16 within the refrigerant tank 3 described in the eleventh embodiment. In FIG. 24, the flow of the boiling vapor is indicated with broken arrow line and the flow of the condensed liquid is indicated with full arrow line. The inner fin 13 are formed by alternately folding an aluminum plate, for example, into a corrugation shape (or a concave and convex shape), and bonded by brazing or the like to the inside wall surfaces of the pair of pressed plates 8 facing each other. By inserting the inner fins 13 into the boiling area 16, as illustrated in FIG. 24, boiling vapor outflow passages can be formed between the pair of pressed plates 8 facing the inner fins 13.

In this way, the flow of the boiling vapor is smoothened and smoothly discharged from the boiling area 16. Further, as the heat radiation area of the refrigerant tank 3 is substantially increased by providing the inner fins 13, the heat radiability may be improved. Furthermore, as the inner fins 13 function as reinforcing materials to support the wall surface of the refrigerant tank 3 (the mounting surface of the pressed plate 8), even if the rigidity of the mounting surface of the pressed plate 8 to which the IGBT module 2 is mounted is not sufficient, such lack of the rigidity of the mounting surface can be reinforced.

Figure 25:
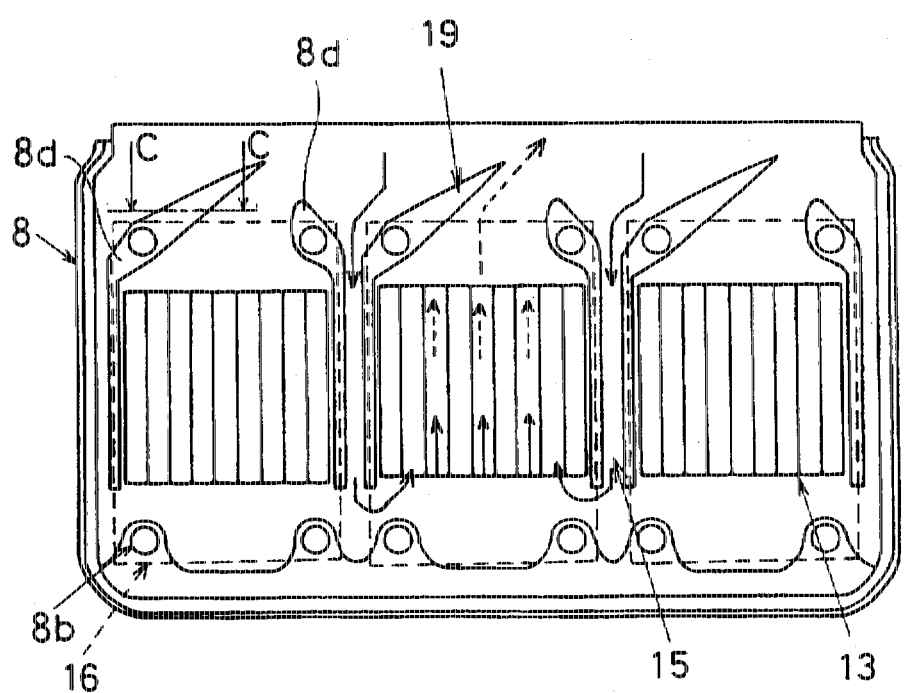
FIG. 25 is a plan view illustrating a pressed plate of a thirteenth embodiment.

A thirteen embodiment will be described with respect to FIG. 25.

In this embodiment, refrigerant guide plates 19 are provided at the upper part within the refrigerant tank 3 to introduce the condensed liquid into the respective refrigerant supply passages 15. In FIG. 25, the flow of the boiling vapor is indicated by broken arrow lines and the flow of the condensed liquid is indicated with full arrow line. As illustrated in FIG. 25, the refrigerant guide plate 19 is upwardly slanted from one of the sides of the fastening parts 8d (left side in FIG. 25) on the upper side. In this way, as the condensed liquid can be received by the guide plate 19 and then directly introduced into the refrigerant supply passage 15, the interference between the boiling vapor and the condensed liquid can be reduced, and the heat radiability can be improved.

Figure 26:
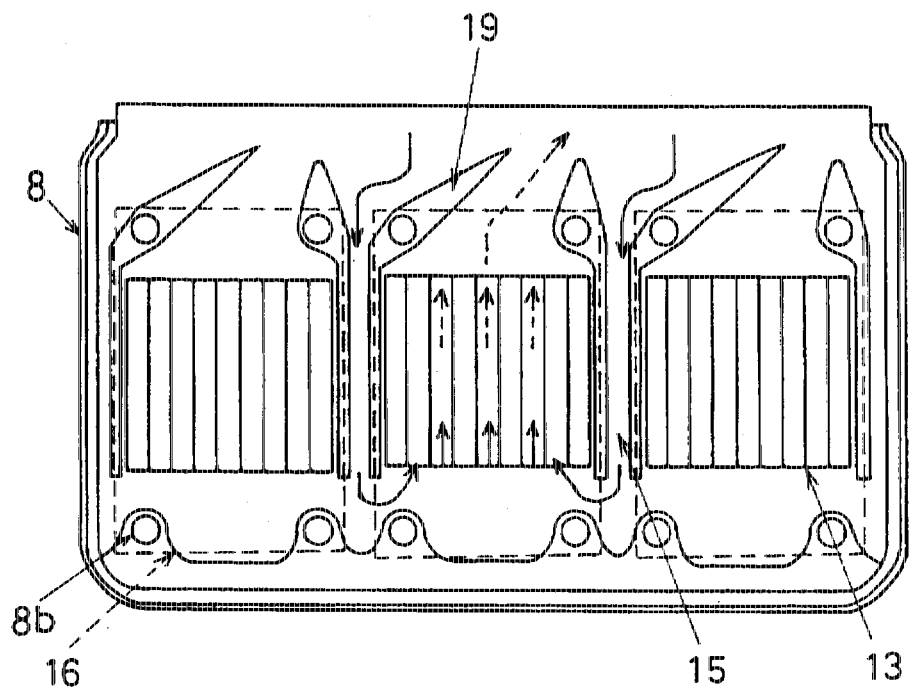
FIG. 26 is a plan view illustrating the pressed plate of the thirteenth embodiment.

In such a case, as illustrated in FIG. 26, by upwardly extending the fastening part 8d on the other side where the refrigerant guide plate 19 is not provided, the interference between the boiling vapor flowing out of the boiling area 16 along the refrigerant guide plate 19 and the condensed liquid flowing down from the heat radiator 4 can be reduced. It is preferable that the shape of the expended part of the fastening part 8d be formed in such a manner that the cross section smoothly varies to prevent any disturbance of the flow of the boiling vapor, such as breakaway.

Figure 27:
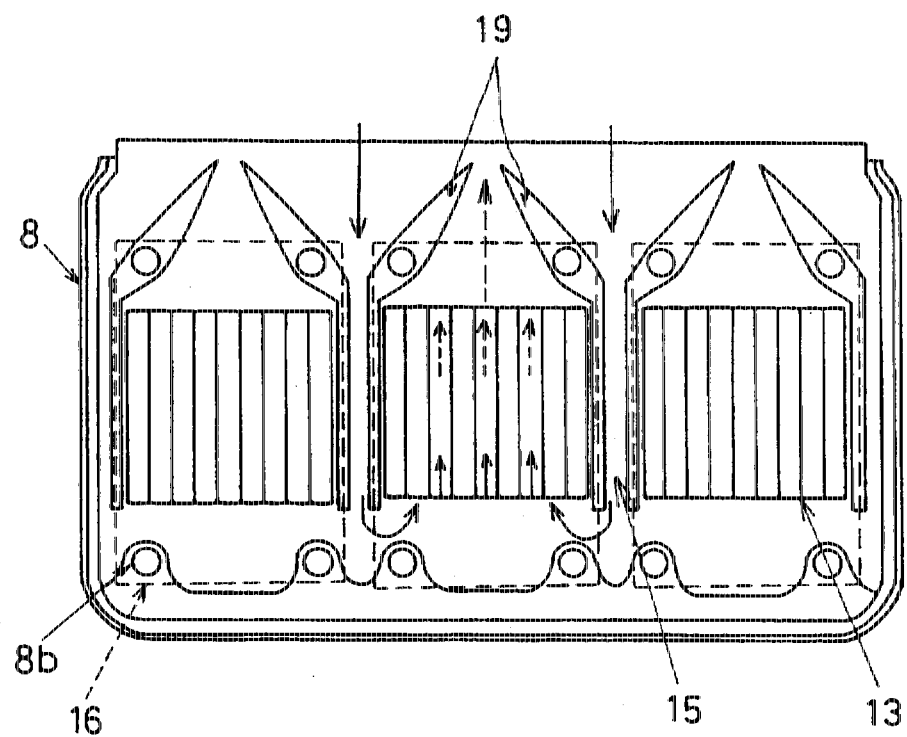
FIG. 27 is a plan view illustrating a pressed plate of a fourteenth embodiment.
Figure 28:
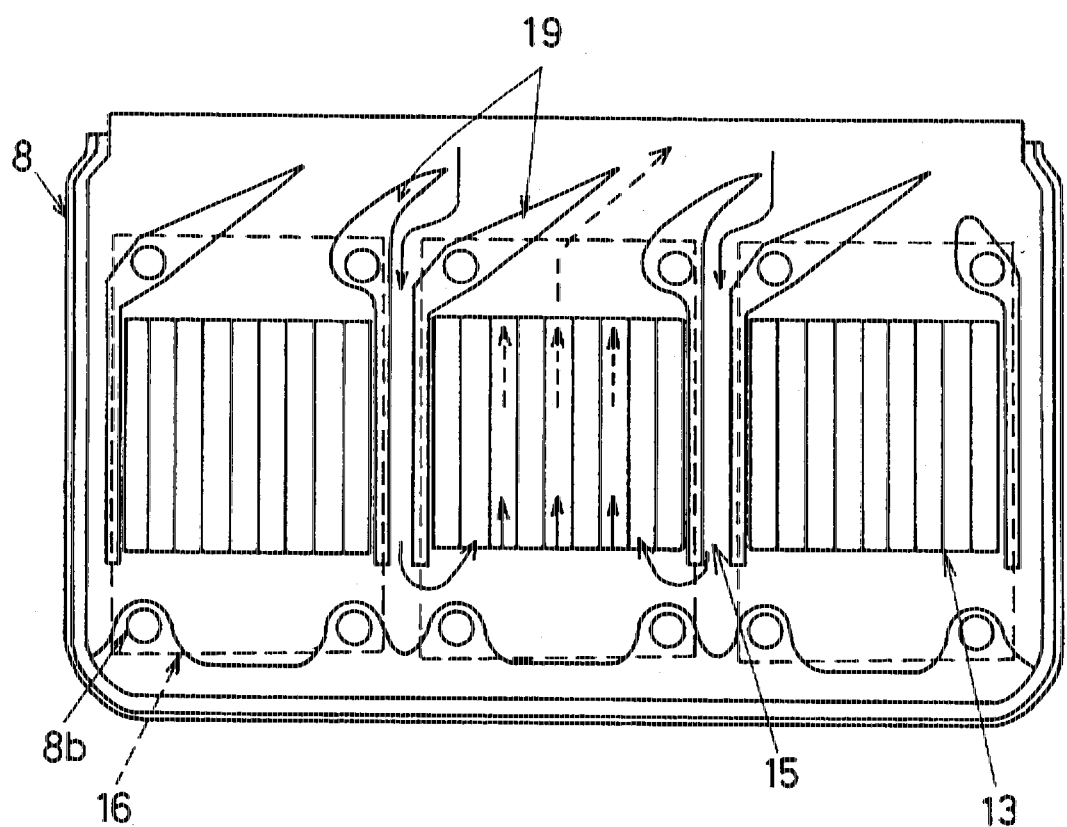
FIG. 28 is a plan view illustrating a modification of the pressed plate of a fourteenth embodiment.

A fourteenth embodiment will be described with respect to FIGS. 27 and 28.

In this embodiment, the refrigerant guide plate 19 is provided at each side of the boiling area 16 at the upper part. In FIGS. 27 and 28, the flow of the boiling vapor is indicated with broken arrow line and the flow of the condensed liquid is indicated with solid arrow line. The refrigerant guide plates 19 at each side may be formed in generally an identical shape and disposed facing each other as illustrated in FIG. 27 or may be formed in a different shape and disposed facing each other as illustrated in FIG. 28. In this way, the condensed liquid can effectively be introduced into the refrigerant supply passage 15, the heat radiability being thereby further improved.

The refrigerant guide plate 19 described in the thirteenth and fourteenth embodiments may be integrally provided with the couple of pressed plates 8 forming the refrigerant tank 3 by pressing, or may be structured of the pressed plates 8 with separate spacer.

A fifteenth embodiment of the present embodiment will be described with respect to FIGS. 29 and 30.

Figure 29:
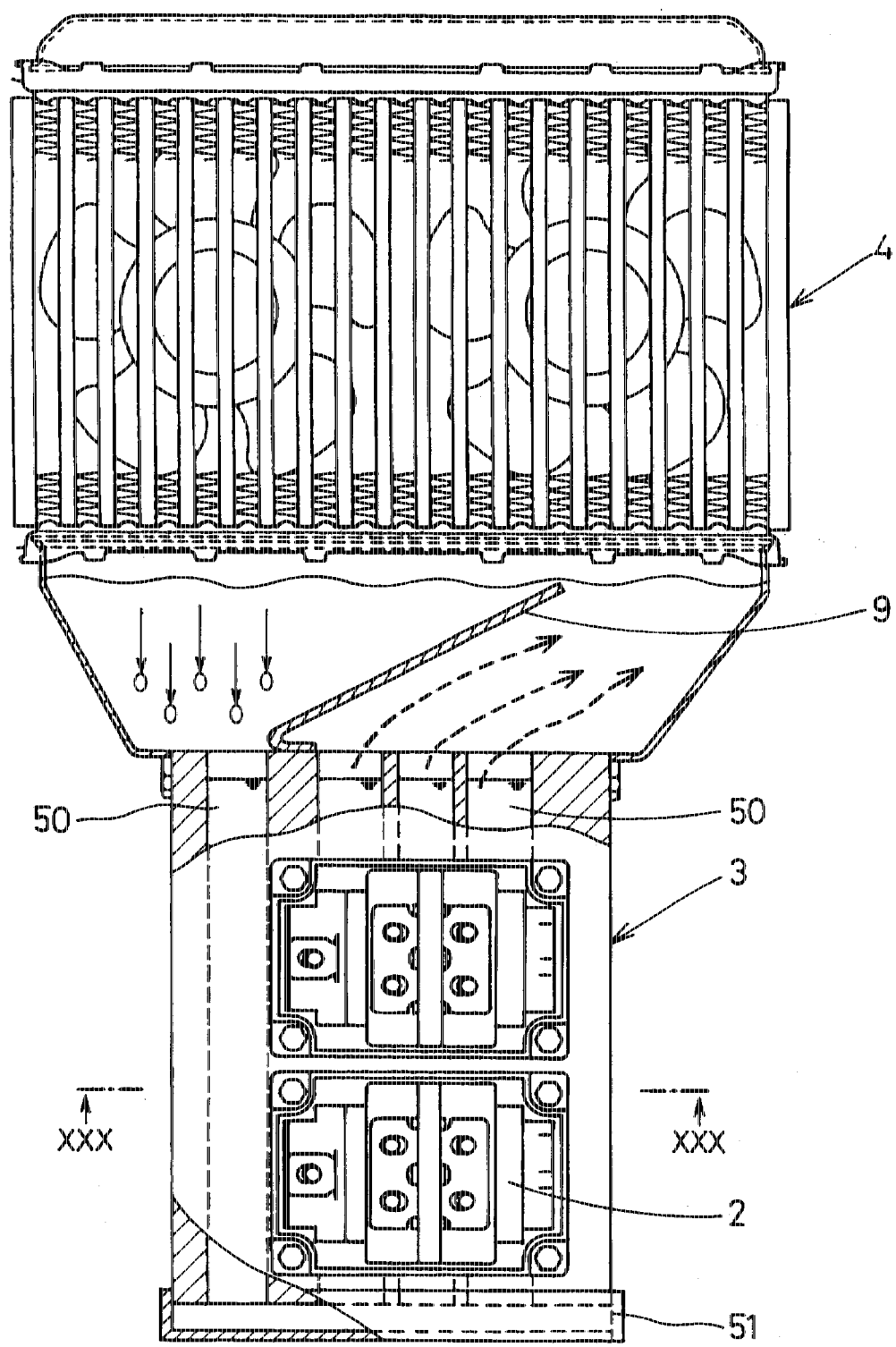
FIG. 29 is a front view illustrating a cooling apparatus of a fifteenth embodiment.

As illustrated in FIG. 29, the refrigerant tank 3 are composed of extruded material having a plurality of separate spaces 50 and an end cap 51 which seals the above spaces 50 in communication therewith. A guide plate 9 is provided at the upper end part of the refrigerant tank 3 to separate the ascending boiling vapor generated within the refrigerant tank 3 and the descending condensed liquid generated at the condensing part within the heat radiator from each other.

The present invention has been described in connection with what are presently considered to be the most practical preferred embodiments. However, the invention is not meant to be limited to the disclosed embodiments, but rather is intended to include all modifications and alternative arrangements included within the spirit and scope of the appended claims.

What is claimed is:

1. A cooling apparatus using boiling and condensing refrigerant comprising:
    a heating body;
    a refrigerant tank composed of at least two thin plate materials facing each other and bonded together at bonding parts thereof, said heating body being mounted on an outer surface of said thin plates;
    refrigerant sealed in said refrigerant tank for adsorbing heat generated by said heating body, said refrigerant vaporizing in said refrigerant tank;
    a heat radiator mounted on said refrigerant tank in fluid communication therewith for condensing and liquefying boiling vapor ascending from said refrigerant tank; and
    a refrigerant flow control plate composed of a plate material and disposed in an upper part of said refrigerant tank in contact with said thin plate materials;
    wherein said refrigerant flow control plate partitions an inside of said refrigerant tank into a plurality of vapor outlets and a plurality of liquid inlets, said vapor outlets are defined by one surface of said refrigerant flow control plate and said thin plate materials to flow out said boiling vapor boiled and ascending within said refrigerant tank into said heat radiator, and said liquid inlets are defined by the other surface of said refrigerant flow control plate and said thin plate materials to introduce said condensed liquid into said refrigerant tank, each of said liquid inlets being disposed in alternate relation with respect to a vapor outlet.

2. A cooling apparatus according to claim 1, wherein said refrigerant flow control plate is slanted at said upper part within said refrigerant tank.

3. The cooling apparatus according to claim 1, wherein said refrigerant flow control plate extends from the upper part to inside of said refrigerant tank.

4. The cooling apparatus according to claim 1, wherein said refrigerant flow control plate extends generally in vertical direction along each side of a region corresponding to a mounting location of said heating body within said refrigerant tank.

5. A cooling apparatus according to claim 1, wherein said refrigerant tank includes a plurality of passages in communication with said vapor outlet within said refrigerant tank therein.

6. A cooling apparatus according to claim 5, wherein said plurality of passages are defined by fins disposed within said refrigerant tank, and said fins are disposed in such a manner that an outer surface of said fin is in contact with an inside wall surface of said refrigerant tank.

7. A cooling apparatus according to claim 1, wherein said couple of thin plate materials are made of a pair of pressed and bonded plates, and said refrigerant flow control plate is integrally formed with said pair of plates by pressing.

8. A cooling apparatus according to claim 1, wherein said heating body is mounted in such a manner to contact with one outer surface of the refrigerant tank in thickness direction thereof, and said vapor outlet and said liquid inlet are defined by said thin refrigerant flow control plate which partitions the inside of the refrigerant tank into two sections in thickness direction thereof, and a communication opening is provided under said refrigerant flow control plate to communicate with the two sections each other.

9. A cooling apparatus according to claim 8, wherein said refrigerant flow control plate includes a guide plate at an upper side thereof to introduce said condensed liquid condensed within said heat radiator and flowing down into said liquid inlet.

10. A cooling apparatus according to claim 8, wherein said refrigerant flow control plate includes a protrusion part protruding toward an inner surface of said refrigerant tank, and said tip end of said protrusion part is in contact with said inner wall surface of said refrigerant tank.

11. A cooling apparatus according to claim 8, wherein said refrigerant tank is composed of a pair of pressed plates bonded together, and said heating body is mounted on an outer surface of said plates in contact therewith.

12. A cooling apparatus according to claim 1, wherein said liquid inlet extends vertically along each side of a boiling area heated by said heating body within said refrigerant tank.

13. A cooling apparatus according to claim 12, wherein said liquid inlet have a width of said refrigerant tank wider than that of said boiling area.

14. A cooling apparatus according to claims 12, wherein said liquid inlet is composed of at least two materials, one of which forms said refrigerant tank.

15. A cooling apparatus according to claim 12, wherein said refrigerant tank includes therein inner fins for forming outflow passage for introducing said boiling vapor from said boiling area into said vapor outlet, and outer surfaces of said inter fins are in contact with an inner wall surface of said thin plate material forming said refrigerant tank.

16. A cooling apparatus using boiling and condensing refrigerant comprising:

a heating body;

a refrigerant tank composed of at least two thin plate materials facing each other and bonded together at bonding parts thereof, said heating body being mounted on a surface of said thin plates;

refrigerant sealed in said refrigerant tank for absorbing heat generated by said heating body, said refrigerant vaporizing in said refrigerant tank;

a heat radiator mounted on said refrigerant tank in fluid communication therewith for condensing and liquefying boiling vapor ascending from said refrigerant tank;

a plurality of vapor outlets through which said vapor boils and ascends within said refrigerant tank;

a plurality of liquid inlets through which said liquid condensed at said heat radiator and falling down is introduced into said refrigerant tank; and a refrigerant flow control plate composed of a plate material and disposed in an upper part of said refrigerant tank in contact with said thin plate materials;

wherein said vapor outlets and said liquid inlets are defined by said refrigerant flow control plate and said thin plate materials and each of said liquid inlets is disposed in alternate relation with respect to a vapor outlet.

17. A cooling apparatus using boiling and condensing refrigerant comprising:

a refrigerant tank composed of at least two thin plate materials facing each other, the refrigerant tank sealing therein refrigerant which is boiled by receiving heat generated by a heating body;

a heat radiator mounted on said refrigerant tank in fluid communication therewith for condensing and liquefying boiling vapor ascending from said refrigerant tank; and a refrigerant flow control plate composed of a plate material and disposed in an upper part of said refrigerant tank in contact with said thin plate materials;

wherein said refrigerant flow control plate partitions an inside of said refrigerant tank into a plurality of vapor outlets and a plurality of liquid inlets, said vapor outlets are defined by one surface of said refrigerant flow control plate and said thin plate materials to flow out said boiling vapor boiled and ascending within said refrigerant tank into said heat radiator, and said liquid inlets are defined by the other surface of said refrigerant flow control plate and said thin plate materials to introduce said condensed liquid into said refrigerant tank.

18. The cooling apparatus according to claim 17, wherein an opening area of the liquid inlets are larger than an opening area of the vapor outlets.

19. A cooling apparatus according to claim 17, wherein the vapor outlets and the liquid inlets are alternately formed over an entire area of the refrigerant tank.

* * * * *